US005969379A

United States Patent [19]

Thompson et al.

[11] Patent Number: 5,969,379

[45] Date of Patent: Oct. 19, 1999

[54] MEMORY AND OTHER INTEGRATED CIRCUITRY HAVING A CONDUCTIVE INTERCONNECT LINE PITCH OF LESS THAN 0.6 MICRON

[75] Inventors: J. Wayne Thompson; Troy A. Manning, both of Boise, Id.

[73] Assignee: Micron Technology, Inc., Boise, Id.

[21] Appl. No.: 09/076,328

[22] Filed: May 11, 1998

Related U.S. Application Data

[63] Continuation of application No. 08/848,529, Apr. 28, 1997, Pat. No. 5,751,031, which is a continuation of application No. 08/431,900, May 1, 1995, abandoned.

[51] Int. Cl.[6] .......................... H01L 27/10; H01L 29/76; H01L 31/062; H01L 31/113

[52] U.S. Cl. .......................... 257/208; 257/211; 257/382; 257/390; 257/401; 257/758

[58] Field of Search .......................... 257/72, 211, 206, 257/8, 390, 82, 758, 923, 401

[56] References Cited

U.S. PATENT DOCUMENTS

| | | | |
|---|---|---|---|
| 4,965,651 | 10/1990 | Wagner | 257/211 |
| 5,250,457 | 10/1993 | Dennison | 437/48 |
| 5,321,280 | 6/1994 | Sakai | 257/211 |
| 5,396,100 | 3/1995 | Yamasaki et al. | 257/390 |
| 5,401,992 | 3/1995 | Ono | 257/315 |
| 5,404,033 | 4/1995 | Wong | 257/202 |
| 5,652,457 | 7/1997 | Ikeda et al. | 257/380 |
| 5,734,188 | 3/1998 | Murata et al. | 257/401 |

FOREIGN PATENT DOCUMENTS

| | | | |
|---|---|---|---|
| 53-63877 | 6/1978 | Japan | 257/208 |

*Primary Examiner*—Teresa M. Arroyo
*Attorney, Agent, or Firm*—Wells, St. John, Roberts, Gregory & Matkin P.S.

[57] ABSTRACT

Integrated circuitry includes, a) a first array of electronic devices comprising a series of conductive runners extending outwardly of the memory array with adjacent runners having a device pitch of 0.6 micron or less in a pitch direction, b) a second array of electronic devices peripheral to the first array, the 0.6 pitch conductive runners of the first array extending into the second array, at least some of the conductive runners of the series having respective disjointed gaps therewithin within the second array, the gaps being aligned with one another in the second array, c) a cross running conductor extending substantially parallel with the pitch direction and over the aligned gaps within the second array, d) an insulating dielectric layer provided relative to the disjointed gaps within the second array; and e) a series of electrically conductive plugs provided within the insulating dielectric layer and running substantially perpendicular to the pitch direction within the second array, the conductive plugs respectively extending across the respective gaps between and electrically interconnecting the respective disjointed conductive runners within the second array, the cross running conductor extending elevationally over the conductive plugs. Memory integrated circuitry is also disclosed which incorporates electrically conductive plugs which electrically interconnect disjointed active area regions of different transistors in pitch cells.

32 Claims, 7 Drawing Sheets

MEMORY AND OTHER INTEGRATED CIRCUITRY HAVING A CONDUCTIVE INTERCONNECT LINE PITCH OF LESS THAN 0.6 MICRON

RELATED PATENT DATA

This patent resulted from a continuation patent application of U.S. patent application Ser. No. 08/848,529, filed Apr. 28, 1997, entitled "Memory and Other Integrated Circuitry Having a Conductive Interconnect Line Pitch of Less Than 0.6 Micron", naming J. Wayne Thompson and Troy A. Manning as inventors, and which is now U.S. Pat. No. 5,751,031. That patent resulted from a file wrapper continuation application of U.S. patent application Ser. No. 08/431,900, filed on May 1, 1995, entitled "Memory and Other Integrated Circuitry Having a Conductive Interconnect Line Pitch of Less Than 0.6 Micron", naming J. Wayne Thompson and Troy A. Manning as inventors now abandoned.

TECHNICAL FIELD

This invention relates to memory integrated circuitry and to other integrated circuitry.

BACKGROUND OF THE INVENTION

Integrated circuits are chemically and physically integrated into a substrate, such as a silicon wafer, by patterning regions in the substrate and by patterning layers on the substrate. These regions and layers can be conductive for conductor and resistor fabrication. They can also be of different conductivity types, which is essential for transistor and diode fabrication.

Integrated circuit density continues to increase, thereby requiring tighter (smaller) device-to-device spacing. Semiconductor circuits are typically laid out in arrays of identical cells which provide a common function. For example with respect to memory integrated circuitry, a central array area provides an ordered arrangement of individual memory cells. Circuitry for reading and writing to the respective cells, is as well as accessing the respective cells, are typically provided peripherally relative to the memory array itself. One type of peripheral circuitry is classified as "pitch cells". These can constitute a number of different types of cells, such as: a) sense amps; b) row decoders; c) data pass devices; and d) column decoders. Each of these "pitch cells" constitutes multiple transistor devices. These devices typically have common active area diffusion regions formed within the substrate, as the pitch cell circuitry interconnection requires that certain specific active areas be interconnected with other active areas of other transistors.

FIG. 1 illustrates a portion of a prior art layout of peripheral pitch cells associated with a dynamic random access memory (DRAM) array. Specifically, a wafer fragment 10 includes an array of memory cells 12 and peripheral pitch cells 14. The example illustrated pitch cells comprise a series of outer p-sense amps, with one such sense amp being indicated by the depicted outline 16. P-sense amp 16 includes a series of six transistors 20, 21, 22, 23, 24 and 25. The illustrated broken outlines within outline 16 depict active area diffusion regions within the bulk substrate. As is apparent, the left illustrated active areas of transistors 21, 22 and 23 constitute a common interconnected diffusion region. Likewise, the left indicated diffusion regions of transistors 24 and 25 are also interconnected.

It would be desirable to improve upon such prior art constructions and arrays of pitch cells where adjacent conductive runner or line pitch falls below 0.6 micron.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
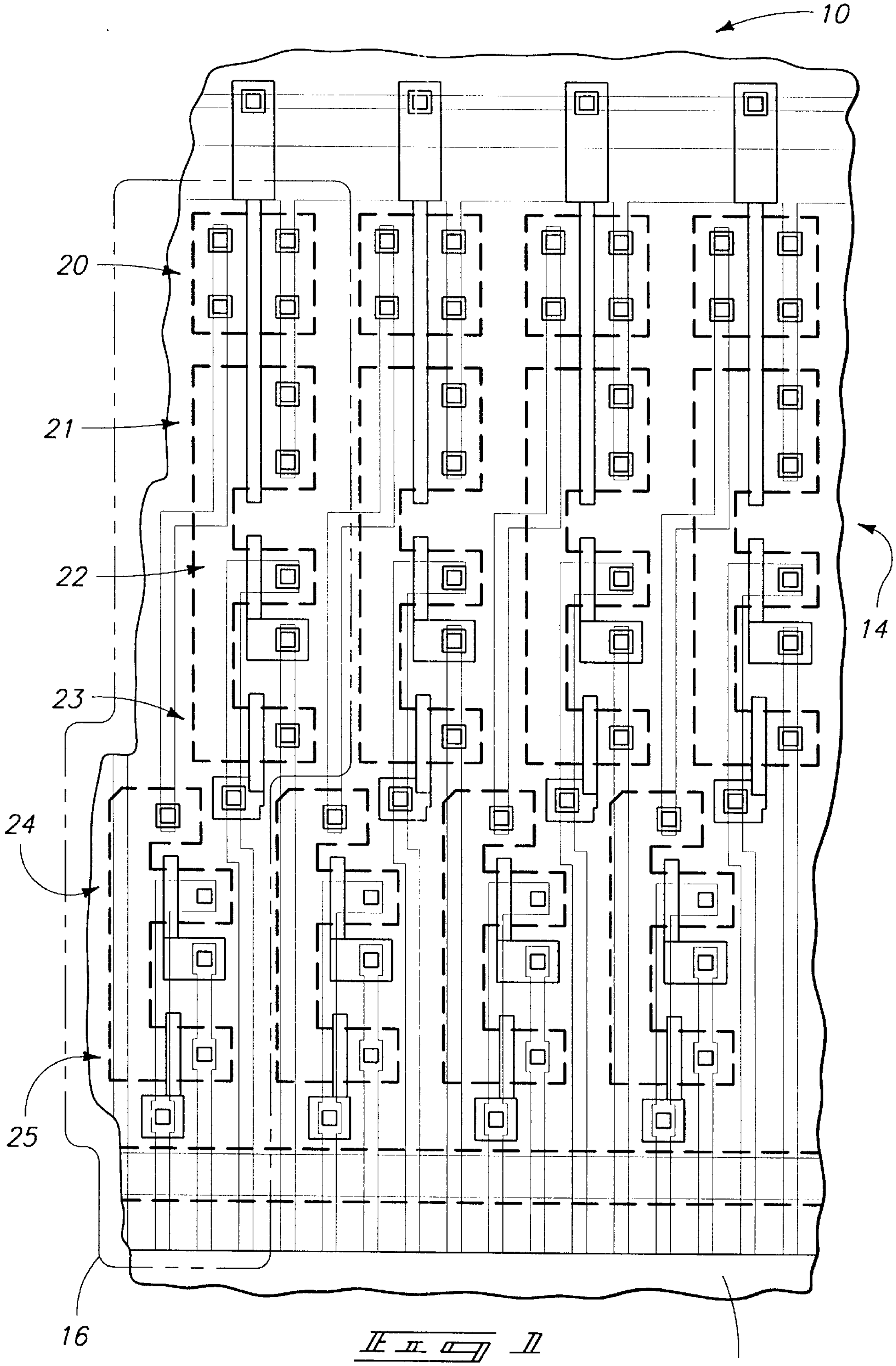
FIG. 1 is a top view of a prior art semiconductor wafer fragment, illustrating a prior art layout design of peripheral pitch cells, and is discussed in the "Background" section above.
Figure 2:
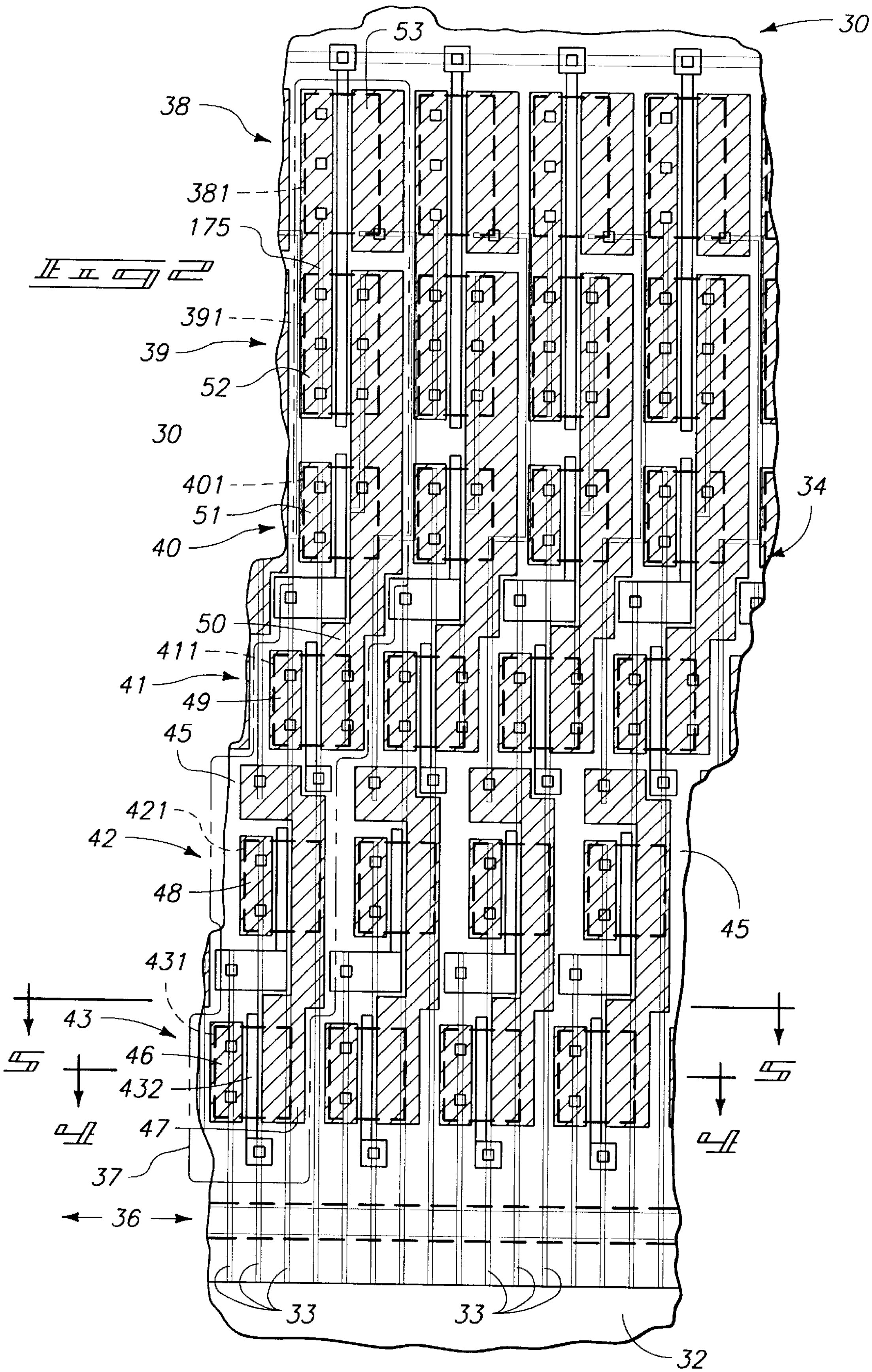
FIG. 2 is a top view of a semiconductor wafer fragment in accordance with the invention, illustrating a layout design of peripheral pitch cells.

This disclosure of the invention is submitted in furtherance of the constitutional purposes of the U.S. Patent Laws "to promote the progress of science and useful arts" (Article 1, Section 8).

In accordance with one aspect of the invention, memory integrated circuitry comprises:

- an array of memory cells, the memory cells comprising a series of conductive interconnect runners extending outwardly of the memory array, adjacent interconnect runners having a pitch of 0.6 micron or less;
- an array of pitch cells peripheral to the memory array, the pitch cells comprising the memory array series of conductive interconnect runners and correspondingly being on pitch with the array of memory cells, the pitch cell array comprising pitch cells respectively having a plurality of field effect transistors having associated source/drain diffusion regions;
- within a respective pitch cell, separate field effect transistors having disjointed source/drain diffusion regions;
- an insulating dielectric layer overlying the respective pitch cell; and
- an electrically conductive plug provided within the insulating dielectric layer in the pitch cell array, the conductive plug extending between and electrically interconnecting a pair of disjointed source/drain diffusion regions of different transistors.

In accordance with another aspect of the invention, integrated circuitry comprises:

- a first array of electronic devices, the first array comprising a series of conductive runners extending outwardly of the memory array, adjacent runners within the first array having a device pitch of 0.6 micron or less in a pitch direction;
- a second array of electronic devices peripheral to the first array, the 0.6 pitch conductive runners of the first array extending into the second array, at least some of the conductive runners of the series having respective disjointed gaps therewithin within the second array, the gaps being aligned with one another in the second array;

a cross running conductor extending substantially parallel with the pitch direction and over the aligned gaps within the second array;

an insulating dielectric layer overlying the conductive runners within the second array; and a series of electrically conductive plugs provided within the insulating dielectric layer and running substantially perpendicular to the pitch direction within the second array, the conductive plugs respectively extending across the respective gaps between and electrically interconnecting the respective disjointed conductive runners within the second array, the cross running conductor extending elevationally over the conductive plugs.

In accordance with yet another aspect of the invention, integrated circuitry comprises:

an array of electronic devices, the array including conductive runners having a pitch of 0.6 micron or less in a pitch direction, at least one of the conductive runners including a disjointed gap therewithin;

an insulating dielectric layer overlying the conductive runner; and an electrically conductive plug provided within the insulating dielectric layer and running substantially perpendicular to the pitch direction, the conductive plug extending across the gap between and electrically interconnecting the disjointed conductive runner.

Referring to FIGS. 2–5, a semiconductor wafer fragment and layout is indicated generally with reference numeral 30. Such comprises an array of memory cells indicated generally with numeral 32. Such memory cells might constitute SRAM or DRAM memory cells. A series of conductive interconnect runners 33 extend outwardly of memory array 32, with adjacent runners 33 having a pitch of 0.6 micron or less in a pitch direction 36. An example pitch is 0.24 micron.

Figure 3:
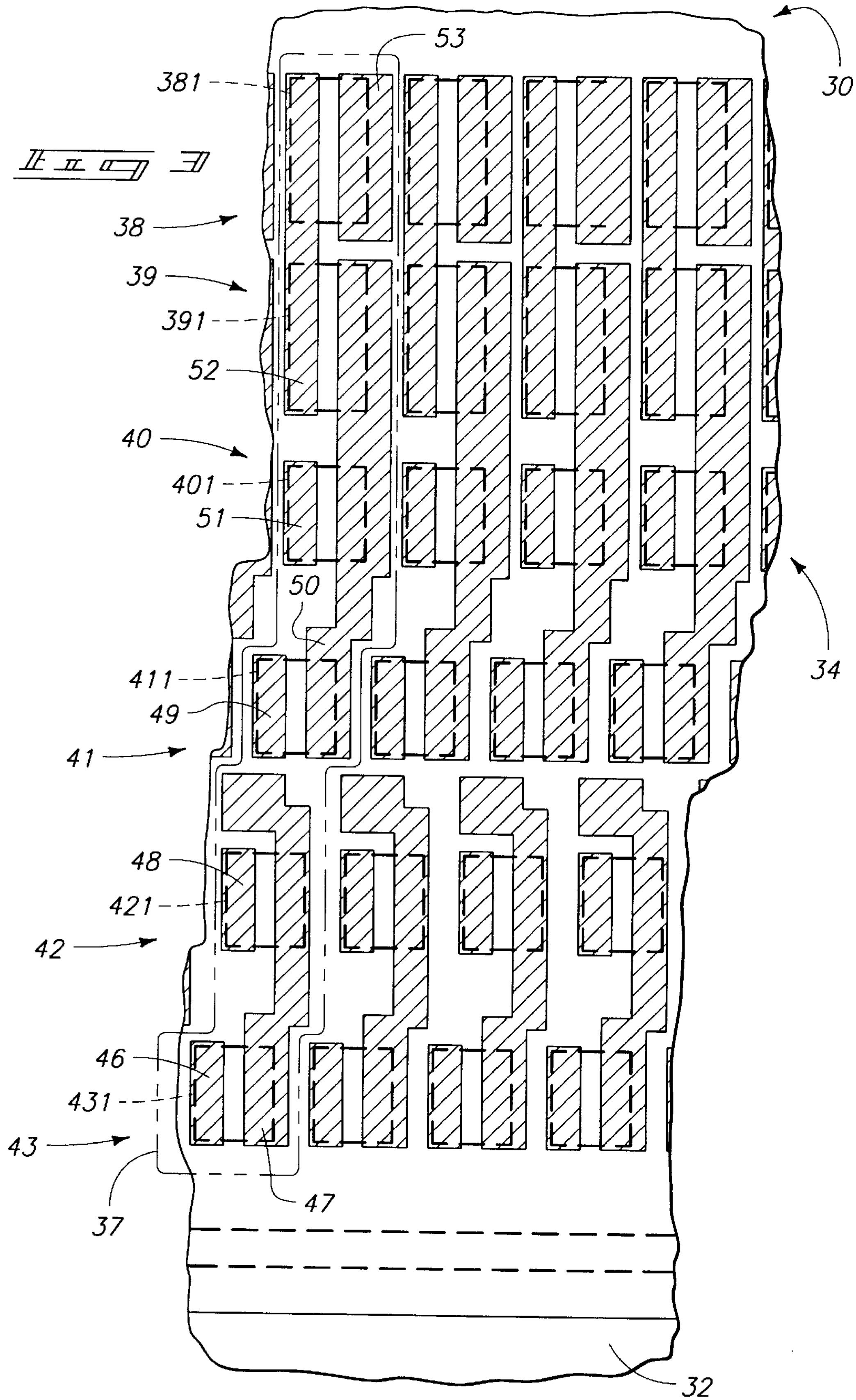
FIG. 3 is a top view of FIG. 2, with some of the circuitry components not being shown for clarity of other circuitry having particular pertinency to the invention.
Figure 4:
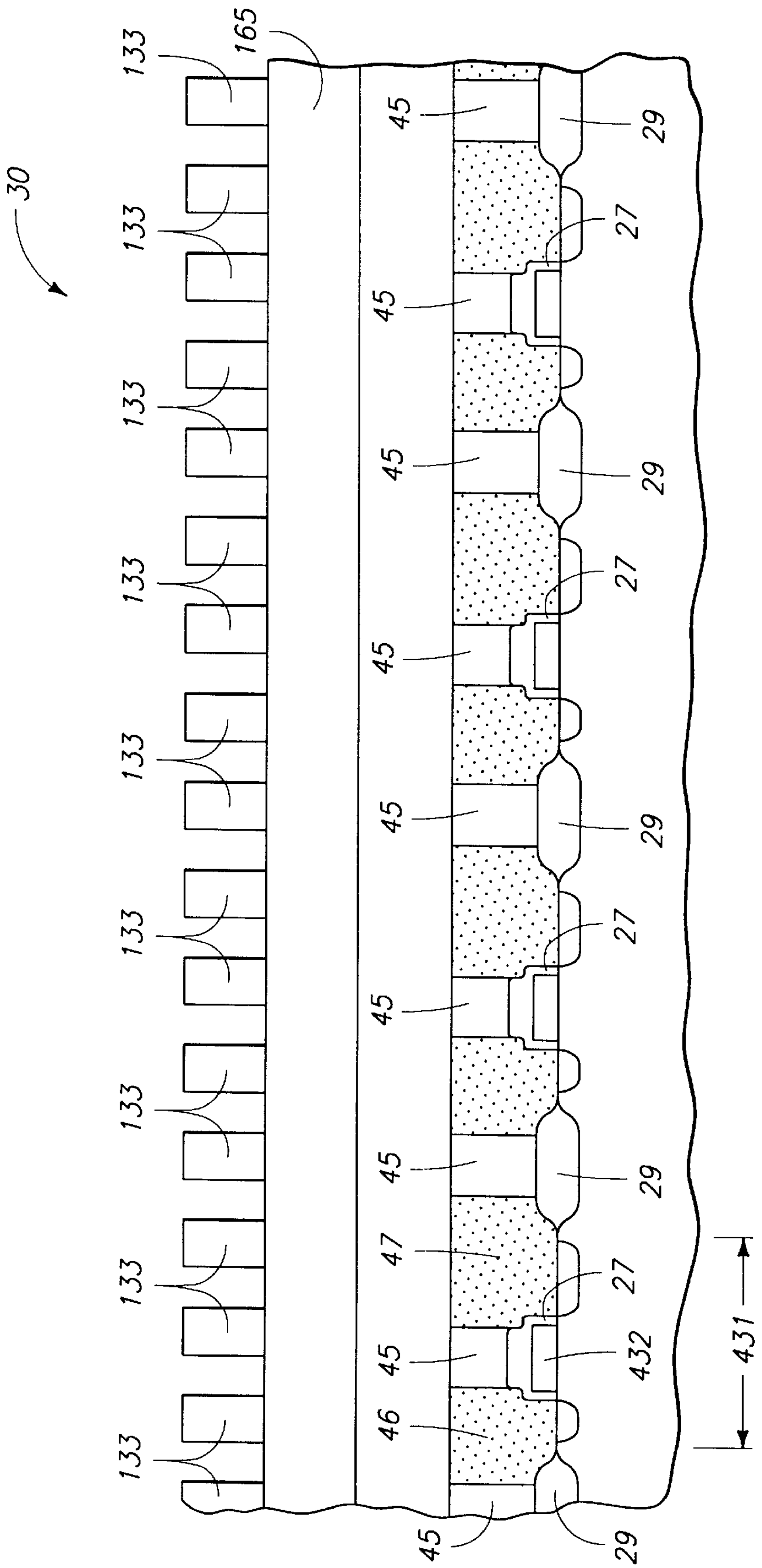
FIG. 4 is an enlarged cross sectional view taken through line 4—4 in FIG. 2.

Peripheral to the memory array is an array of pitch cells 34. Pitch cell array 34 comprises the memory array of interconnect runners 33, and is correspondingly "on pitch" with memory array 32. Specifically, pitch cell array 34 comprises pitch cells respectively having a plurality of field effect transistors having associated source/drain diffusion regions. One such pitch cell in the form of a p-sense amp is indicated by the enclosed outline 37. FIG. 3 constitutes a view of the FIG. 2 layout showing only a portion of the circuitry for clarity. Pitch cell 37 comprises a plurality of transistors 38, 39, 40, 41, 42 and 43. Each has a respective active area region 381, 391, 401, 411, 421 and 431, respectively, shown as dashed lines. Such active area regions constitute disjointed source/drain diffusion regions relative to one another with the bulk silicon substrate, as shown. Accordingly, at least some separate and adjacent field effect transistors within a respective pitch cell have separated and non-continuous source/drain diffusion regions. Transistors 38, 39, 40, 41, 42 and 43 include associated gates which are not all shown with numbers for clarity in the drawings. Specifically, FIGS. 2 and 4 designate a gate 432 of transistor 43. The illustrated gates (FIG. 4) are encapsulated by an insulating nitride.

An insulating dielectric layer 45 (preferably BPSG) overlies the transistors of pitch cell 37. A series of electrically conductive plugs 46, 47, 48, 49, 50, 51, 52, and 53 are provided within insulating dielectric layer 45. Such plugs preferably comprise conductively doped polysilicon. Some of the conductive plugs extend between and electrically interconnect a pair of disjointed source/drain diffusion regions of different transistors. Specifically, conductive plug 47 extends between and interconnects the illustrated right sides of active areas 431 and 421 of transistors 43 and 42, respectively. Conductive plug 50 extends between and interconnects the right sides of active areas 411, 401 and 391 of transistors 41, 40 and 39, respectively. Plug 52 interconnects the left sides of active areas 391 and 381 of transistors 39 and 38, respectively. Also, optionally, other conductive enhancing interconnects can be provided between the electrically coupled active areas as is shown. For example, a patterned metal line 175 (FIG. 2) and its associated contacts are shown overlapping plug 52.

Figure 5:
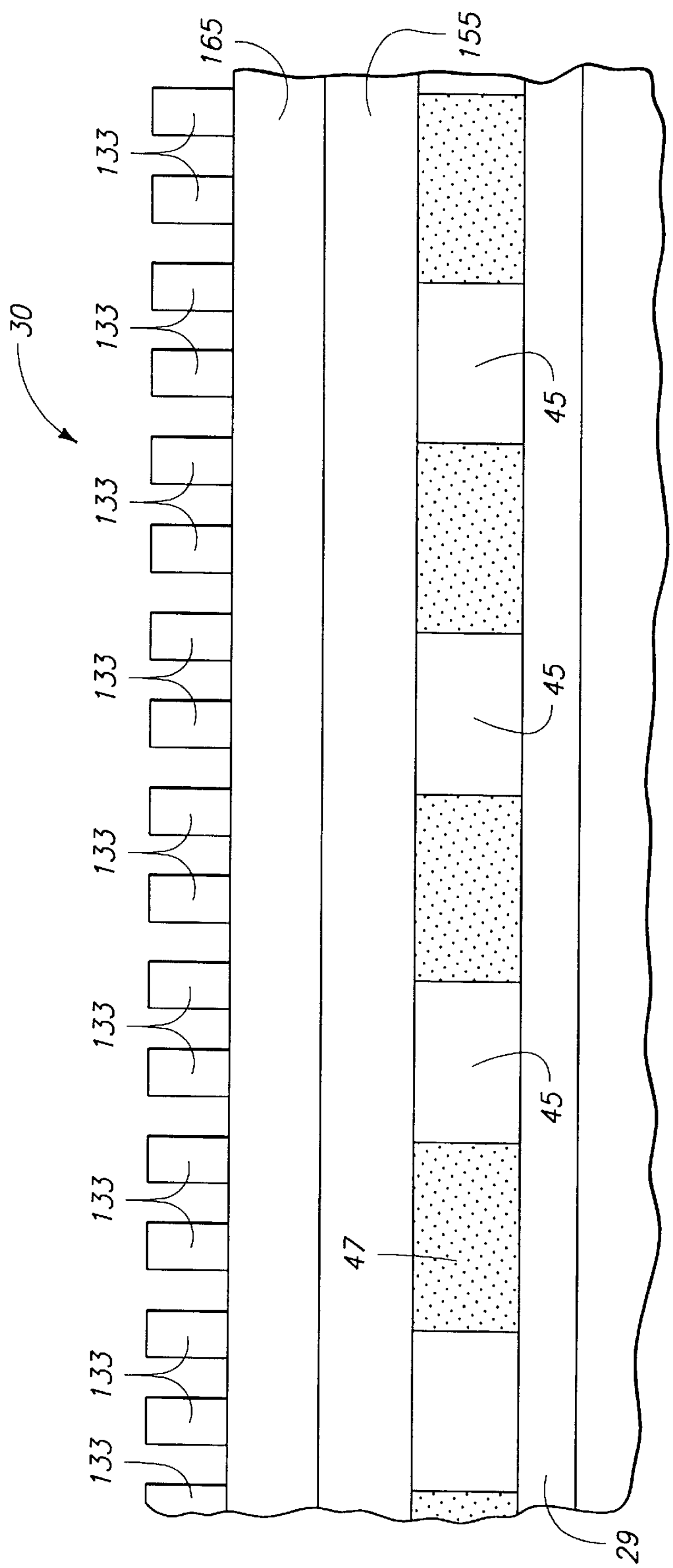
FIG. 5 is an enlarged cross sectional view taken through line 5—5 in FIG. 2.

Field oxide 29 separates the disjointed active area diffusion regions of the separate transistors, with the conductive interconnecting plugs 47, 50 and 52 overlying field oxide 29 (FIG. 5). An insulating layer 155 and an insulating layer 165 (FIGS. 4 and 5) overlie plugs 46, 47, 48, 49, 50, 51, 52, and 53, and insulating layer 45. Such would typically comprise doped or undoped silicon dioxides.

Patterned interconnect runners 33 are provided over layer 165, with four of interconnect lines 33 being utilized for a single pitch cell. Accordingly, the pitch cells of array 34 are on pitch with the pitch of memory array 32, with the pitch of the illustrated peripheral cells constituting four times the line 33 pitch.

Figure 6:
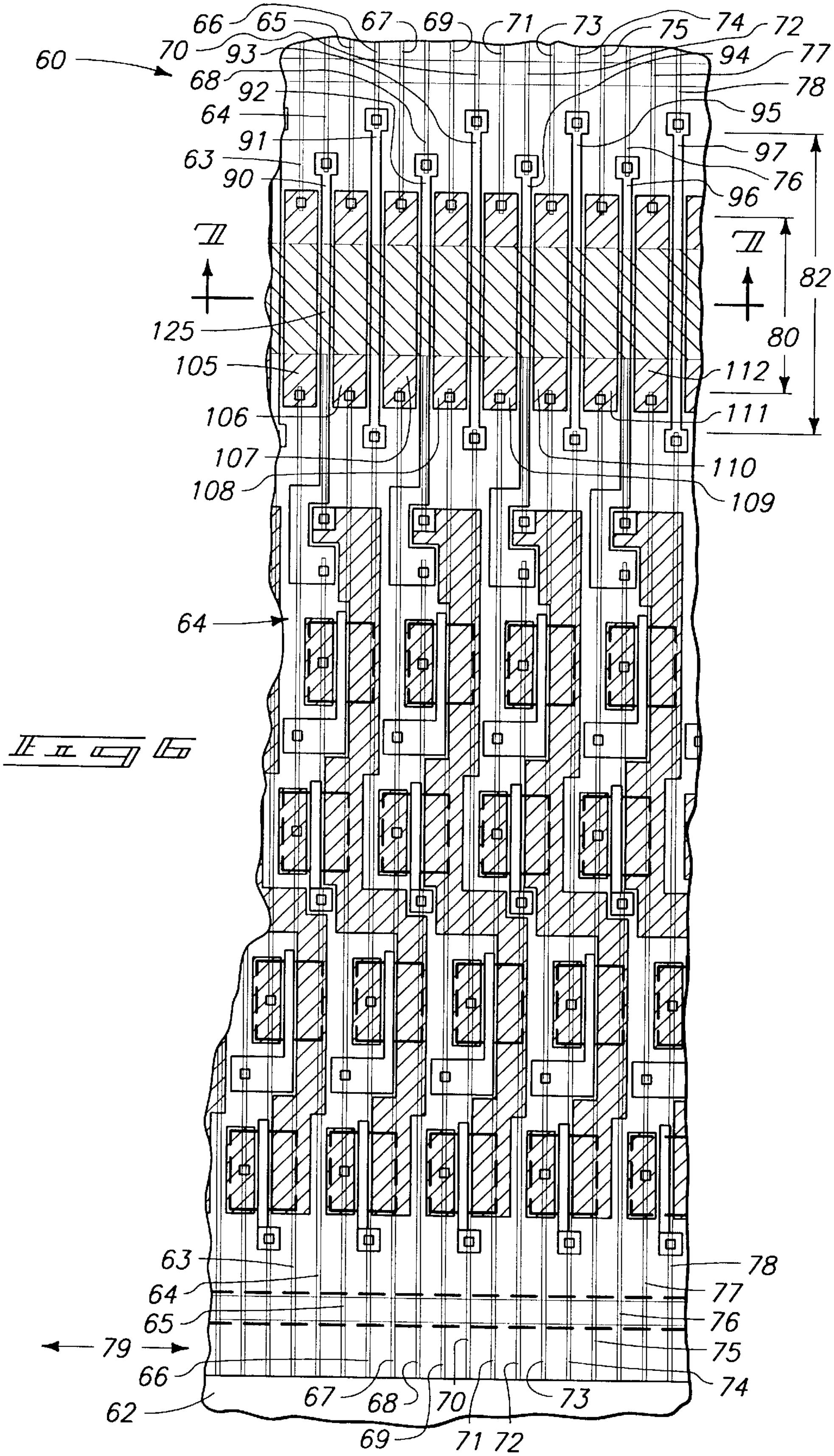
FIG. 6 is a top view of an alternate embodiment semiconductor wafer fragment in accordance with the invention, illustrating an alternate layout design of alternate peripheral pitch cells.

An alternate embodiment in accordance with the invention is described with reference to FIGS. 6 and 7. Such illustrates integrated circuitry 60 which includes a first array 62 of electronic devices and a second array 64 of electronic devices peripheral to first array 62. For example, first array 62 could constitute a memory array with second array 64 constituting pitch cells, with a series of inner p-sense amp pitch cells being illustrated. First array 62 comprises a series of conductive runners 63, 64, 65, 66, 67, 68, 69, 70, 71, 72, 73, 74, 75, 76, 77, 78 which extend outwardly of memory array 62. Adjacent runners within this series as extending from the first array have a device pitch of 0.6 micron or less relative to a pitch direction 79. Runners 63–78 of first array 62 extend outwardly of and into second array 64, and accordingly comprise a part thereof.

At least some of conductive runners 63–78 have respective disjointed gaps therein within second array 64. Specifically, runners 63, 65, 67, 69, 71, 73, 75 and 77 in the illustrated portion comprises a first sub-series of conductive runners having respective disjointed first gaps 80 provided therewithin which are aligned with one another in second array 64. A second sub-series of conductive runners 66, 70, 74 and 78, and a third sub-series 64, 68, 72 and 76 include common respective disjointed second gaps 82 which align with one another, and overlap and align with gaps 80.

Figure 7:
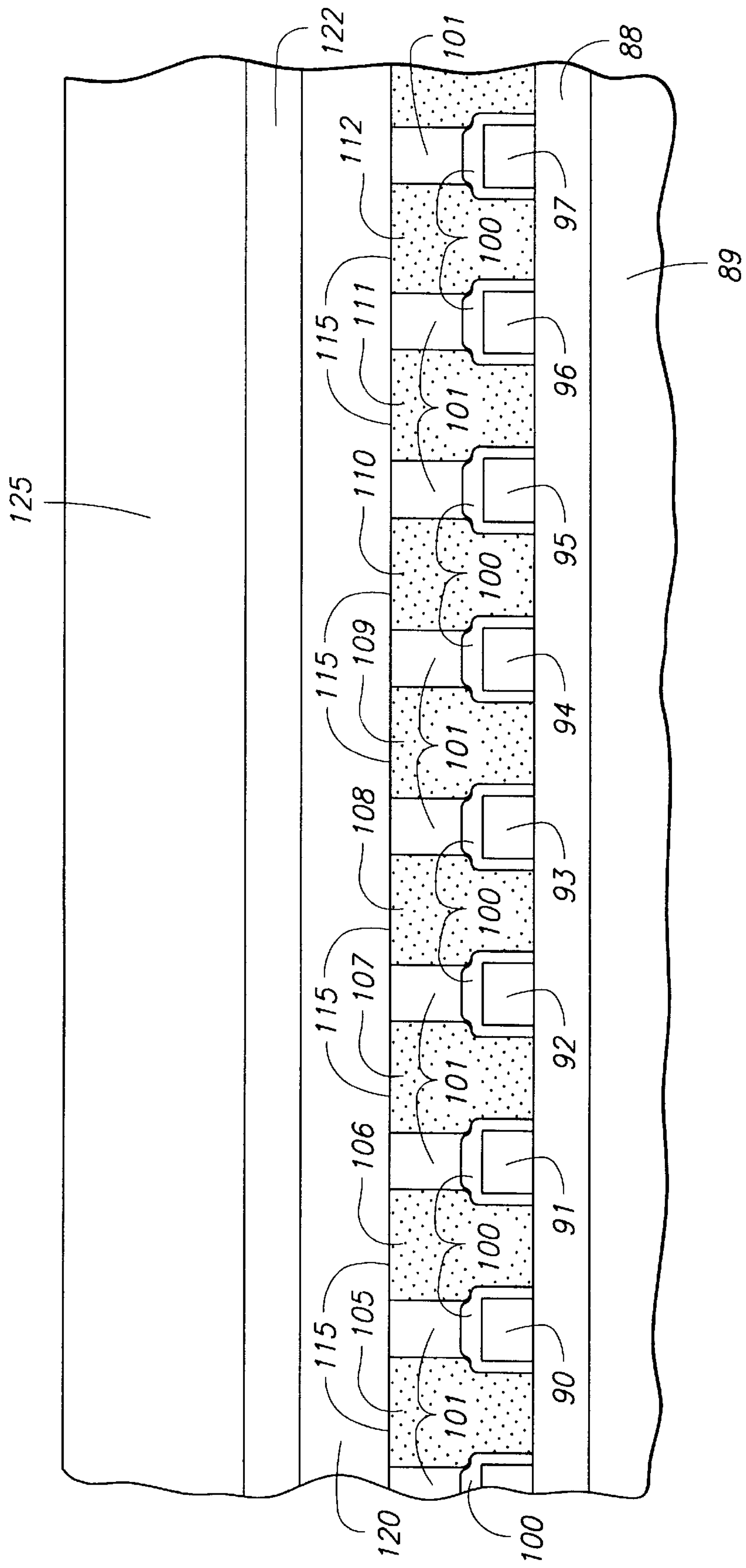
FIG. 7 is a cross sectional view taken through line 7—7 in FIG. 6.

Referring to FIG. 7, field oxide 88 has been provided relative to a base bulk substrate 89. A series of patterned conductive lines 90, 91, 92, 93, 94, 95, 96 and 97 are provided within second array 64 and run substantially perpendicularly relative to pitch direction 79. The series of patterned conductive lines are surrounded by an insulating layer of $Si_3N_4$ 100. An insulating dielectric layer 101 (typically borophosphosilicate glass) is provided over the substrate relative to disjointed gaps 82 and correspondingly disjointed gaps 80. Conductive lines 91, 93, 95 and 97 electrically interconnect first sub-series of disjointed runners 66, 70, 74 and 78 across their respective gaps 82. Patterned conductive lines 90, 92, 94 and 96 electrically interconnect second sub-series of disjointed runners 64, 68, 72 and 76 across their respective gaps 82.

A series of electrically conductive plugs 105, 106, 107, 108, 109, 110, 111, 112 are provided within insulating dielectric layer 101 and run substantially perpendicular to pitch direction 79, and substantially parallel with conductive lines 90–97. Plugs 105–112 extend across gaps 80, and accordingly between and electrically interconnect disjointed conductive runner series 63, 65, 67, 69, 71, 73, and 77 within second array 64. Plugs 105–112 and patterned lines 90–97 preferably constitute the same material, with conductively doped polysilicon being the preferred material. Also as shown in the preferred embodiment, patterned lines 90–97 alternate within the series of conductive plugs 105–112 in second array 64. Conductive plugs 105–112 have respective outermost surfaces 115, with patterned conductive lines 90–97 being provided elevationally lower than such outermost surfaces. The illustrated outermost surfaces 115 define respective planes below which conductive lines 90–97 are disposed.

A first electrically insulating layer 120 and a second electrically insulating layer 122 (preferably doped or undoped silicon dioxides) are provided outwardly of plugs 105–112. A cross running conductor 125 (FIG. 6) extends substantially parallel with pitch direction 79 and over aligned gaps 80, 82 within second array 64 outwardly of insulating layer 122. Accordingly, cross running conductor 125 extends elevationally over or above conductive plugs 105–112. Insulating layers 120, 122 are disposed underneath cross running conductor 125. Insulating dielectric layer 101 is provided underneath insulating layers 120, 122.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. Integrated circuitry comprising:

an array of electronic devices, the array including conductive runners with adjacent runners being laterally spaced from one another and having a pitch of no greater than 0.6 micron in a pitch direction, at least one of the conductive runners including a gap therewithin;

an insulating dielectric layer overlying the conductive runner; and an electrically conductive plug provided within the insulating dielectric layer and running substantially perpendicular to the pitch direction, the conductive plug extending across the gap between and electrically interconnecting the at least one conductive runner which includes the gap.

2. The integrated circuitry of claim 1 wherein the conductive runner comprises metal and the conductive plug comprises conductively doped polysilicon.

3. Integrated circuitry comprising:

a first array having a plurality of electronic devices, the electronic devices comprising a series of conductive interconnect runners extending outwardly of the first array, adjacent interconnect runners being laterally spaced from one another and having a pitch of no greater than 0.6 micron;

a second array having second electronic devices, the second electronic device comprising a series of conductive interconnect runners and correspondingly being on pitch with the first array of electronic devices, the second array of second electronic devices comprising individual second electronic devices respectively having a plurality of field effect transistors having associated source/drain diffusion regions;

within a respective second electronic device, at least some separate and adjacent field effect transistors having separated and non-continuous source/drain diffusion regions;

an insulating dielectric layer overlying the respective second electronic device; and an electrically conductive plug provided within the insulating dielectric layer in the second array, the conductive plug extending between and electrically interconnecting a pair of separated and non-continuous source/drain diffusion regions of different transistors.

4. The integrated circuitry of claim 3 wherein separated diffusion regions of the different transistors are separated by field oxide, the electrically conductive plug overlying the field oxide.

5. The integrated circuitry of claim 3 wherein the electrically conductive plug comprises conductively doped polysilicon.

6. The integrated circuitry of claim 3 wherein separated diffusion regions of the different transistors are separated by field oxide, the electrically conductive plug overlying the field oxide, and the electrically conductive plug comprises conductively doped polysilicon.

7. Memory integrated circuitry comprising:

a memory array having a plurality of memory cells, the memory cells comprising a series of conductive runners extending outwardly of the memory array, adjacent runners within the memory array being laterally spaced from one another and having a device pitch of no greater than 0.6 micron in a pitch direction;

an array of pitch cells peripheral to the memory array, the conductive runners of the memory array extending into the array of pitch cells, at least some of the conductive runners of the series of conductive runners having respective first gaps therewithin within the array of pitch cells, the first gaps being aligned with one another in the pitch direction in the array of pitch cells;

a cross running conductor extending substantially parallel with the pitch direction and over the first gaps within the array of pitch cells;

an insulating dielectric layer provided over the gaps within the array of pitch cells;

a series of electrically conductive plugs provided within the insulating dielectric layer and running substantially perpendicular to the pitch direction within the array of pitch cells, the conductive plugs respectively extending across the respective first gaps between and electrically interconnecting respective conductive runners having respective first gaps within the array of pitch cells, the cross running conductor extending above the conductive plugs; and at least one insulating layer interposed between and electrically isolating the cross running conductor and the series of electrically conductive plugs provided within the insulating dielectric layer.

8. The integrated circuitry of claim 7 wherein the conductive runners comprise metal and the conductive plugs comprise conductively doped polysilicon.

9. The integrated circuitry of claim 7 further comprising a series of patterned conductive lines within the array of pitch cells running substantially parallel with the series of conductive plugs, the patterned conductive lines alternating within the series of conductive plugs in the array of pitch cells.

10. The integrated circuitry of claim 7 further comprising a series of patterned conductive lines within the array of pitch cells running substantially parallel with the series of conductive plugs, the patterned conductive lines alternating within the series of conductive plugs in the array of pitch cells; and the conductive plugs have respective outermost surfaces within the array of pitch cells which define a plane, the patterned conductive lines being provided below the plane defined by the outermost surfaces of the conductive plugs.

11. The integrated circuitry of claim 7 further comprising a series of patterned conductive lines within the array of pitch cells running substantially parallel with the series of conductive plugs, the patterned conductive lines alternating within the series of conductive plugs in the array of pitch cells; and the patterned conductive lines constituting the same conductive material as the conductive plugs.

12. The integrated circuitry of claim 7 further comprising a series of patterned conductive lines within the array of pitch cells running substantially parallel with the series of conductive plugs, the patterned conductive lines alternating within the series of conductive plugs in the array of pitch cells; and the conductive plugs have respective outermost surfaces within the array of pitch cells which define a plane, the patterned conductive lines being provided below the plane defined by the outermost surfaces of the conductive plugs, the patterned conductive lines constituting the same conductive material as the conductive plugs.

13. The integrated circuitry of claim 7 further comprising a series of patterned conductive lines within the array of pitch cells running substantially parallel with the series of conductive plugs, the patterned conductive lines alternating within the series of conductive plugs in the array of pitch cells; and the conductive runners comprise metal and the conductive plugs and the patterned conductive lines comprise conductively doped polysilicon.

14. The integrated circuitry of claim 7 wherein the series of conductive runners comprises a sub-series of conductive runners, the sub-series including respective second gaps therewithin which align with one another in the pitch direction and with the first gaps of the series of runners; and a series of patterned conductive lines within the array of pitch cells running substantially parallel with the series of conductive plugs, the patterned conductive lines alternating within the series of conductive plugs in the array of pitch cells, at least some of the patterned conductive lines interconnecting respective runners of the sub-series across their respective gaps, the cross running conductor extending above the patterned conductive lines.

15. The integrated circuitry of claim 7 wherein the series of conductive runners comprises a sub-series of conductive runners, the sub-series including respective second gaps therewithin which align with one another in the pitch direction and with the first gaps of the series of runners;

a series of patterned conductive lines within the array of pitch cells running substantially parallel with the series of conductive plugs, the patterned conductive lines alternating within the series of conductive plugs in the array of pitch cells, at least some of the patterned conductive lines interconnecting respective runners of the sub-series across their respective gaps, the cross running conductor extending above the patterned conductive lines; and the conductive plugs have respective outermost surfaces within the array of pitch cells which define a plane, the patterned conductive lines being provided below the plane defined by the outermost surfaces of the conductive plugs.

16. The integrated circuitry of claim 7 wherein the series of conductive runners comprises a sub-series of conductive runners, the sub-series including respective second gaps therewithin which align with one another and with the first gaps of the series of runners;

a series of patterned conductive lines within the array of pitch cells running substantially parallel with the series of conductive plugs, the patterned conductive lines alternating within the series of conductive plugs in the array of pitch cells, at least some of the patterned conductive lines interconnecting respective runners of the sub-series across their respective gaps, the cross running conductor extending above the patterned conductive lines; and the patterned conductive lines constituting the same conductive material as the conductive plugs.

17. The integrated circuitry of claim 7 wherein the series of conductive runners comprises a sub-series of conductive runners, the sub-series including respective second gaps therewithin which align with one another and with the first gaps of the series of runners; and a series of patterned conductive lines within the array of pitch cells running substantially parallel with the series of conductive plugs, the patterned conductive lines alternating within the series of conductive plugs in the array of pitch cells, at least some of the patterned conductive lines interconnecting respective runners of the sub-series across their respective gaps, the cross running conductor extending above the patterned conductive lines; and the conductive plugs have respective outermost surfaces which define a plane, the patterned conductive lines being provided below the plane defined by the outermost surfaces of the conductive plugs, the patterned conductive lines constituting the same conductive material as the conductive plugs.

18. Integrated circuitry comprising:

a first array of electronic devices having a series of conductive interconnect runners extending outwardly therefrom, adjacent interconnect runners being laterally spaced from one another and having a pitch of no greater than 0.6 micron;

a second array of second electronic devices peripheral to the first array and operably associated therewith, the second electronic devices individually having at least first and second field effect transistors having associated source/drain diffusion regions formed within semiconductive material; within at least one second electronic device, the first field effect transistor having at least one of its source/drain diffusion regions electrically interconnected with at least one source/drain diffusion region of the second transistor; the one source/drain diffusion region of the first transistor and the one source/drain diffusion region of the second transistor being separated within the semiconductive material;

an insulating dielectric layer overlying the one second electronic device; and an electrically conductive plug formed within the insulating dielectric material, the plug extending between and electrically interconnecting the separated one source/drain diffusion region of the first transistor with the one source/drain diffusion region of the second transistor.

19. Memory integrated circuitry comprising:

a memory array having a plurality of memory cells, the memory cells having a series of conductive runners extending outwardly therefrom in respective common directions, adjacent runners having a pitch no greater than 0.6 micron in a pitch direction which is generally perpendicular to said common direction;

an array of pitch cells peripheral to the memory array, the conductive runners of the memory array extending into the array of pitch cells, at least some of the conductive runners of the series of conductive runners having respective first gaps therewithin within the array of pitch cells, the first gaps being aligned with one another in the array of pitch cells;

a cross running conductor extending substantially parallel with the pitch direction and over the first gaps within the array of pitch cells;

an insulating dielectric layer provided over the first gaps within the array of pitch cells; and a series of electrically conductive plugs provided within the insulating dielectric layer and running substantially perpendicular to the pitch direction within the array of pitch cells, the conductive plugs respectively extending across the respective first gaps between and electrically interconnecting respective conductive runners having first gaps within the array of pitch cells, the cross running conductor extending above the conductive plugs.

20. The integrated circuitry of claim 19 wherein the conductive runners comprise metal and the conductive plugs comprise conductively doped polysilicon.

21. The integrated circuitry of claim 19 further comprising a series of patterned conductive lines within the array of pitch cells running substantially parallel with the series of conductive plugs, the patterned conductive lines alternating within the series of conductive plugs in the array of pitch cells.

22. The integrated circuitry of claim 19 further comprising a series of patterned conductive lines within the array of pitch cells running substantially parallel with the series of conductive plugs, the patterned conductive lines alternating within the series of conductive plugs in the array of pitch cells; and the conductive plugs have respective outermost surfaces at least one of which defines a plane within the array of pitch cells, the patterned conductive lines being provided below said plane.

23. The integrated circuitry of claim 19 further comprising a series of patterned conductive lines within the array of pitch cells running substantially parallel with the series of conductive plugs, the patterned conductive lines alternating within the series of conductive plugs in the array of pitch cells; and the patterned conductive lines constituting the same conductive material as the conductive plugs.

24. The integrated circuitry of claim 19 wherein the series of conductive runners comprises a sub-series of conductive runners, the sub-series including respective second gaps therewithin which align with one another and with the first gaps of the series of runners; and a series of patterned conductive lines within the array of pitch cells running substantially parallel with the series of conductive plugs, the patterned conductive lines alternating within the series of conductive plugs in the array of pitch cells, at least some of the patterned conductive lines interconnecting respective runners of the sub-series across their respective gaps, the cross running conductor extending above the patterned conductive lines.

25. Integrated circuitry comprising:

a first array of electronic devices comprising a series of conductive runners having a device pitch of 0.6 microns or less in a pitch direction;

a second array of electronic devices peripheral to the first array, wherein some of the conductive runners of the first array have gaps aligned with gaps in the second array;

a cross running conductor extending parallel with the pitch direction and over the gaps within the second array;

an insulating dielectric layer over the gaps in the second array; and a series of plugs provided within the insulating dielectric layer and running perpendicular to the pitch direction within the second array and extending across the gaps between and electrically interconnecting the conductive runners within the second array.

26. Dynamic random access memory integrated circuitry comprising:

a semiconductive substrate;

a memory array supported by the substrate;

an array of pitch cells supported by the substrate and peripheral to the memory array and operably associated therewith, the array of pitch cells comprising at least one sense amp having a plurality of transistors with associated source/drain diffusion regions, the source/drain diffusion regions of each transistor of the one sense amp being received within the substrate and being spaced apart and electrically isolated within the substrate from the other source/drain diffusion regions of the other transistors of the one sense amp; and an electrically conductive interconnect disposed over the substrate and electrically interconnecting at least some of the otherwise electrically isolated source/drain diffusion regions of different transistors for the one sense amp.

27. The dynamic random access memory integrated circuitry of claim 26, wherein the one sense amp comprises six transistors.

28. The dynamic random access memory integrated circuitry of claim 27, wherein the one sense amp comprises three electrically conductive interconnects.

29. The dynamic random access memory integrated circuitry of claim 28, wherein two of the three electrically conductive interconnects each electrically interconnect two of the six transistors.

30. The dynamic random access memory integrated circuitry of claim 28, wherein two of the three electrically conductive interconnects each electrically interconnect two different pairs of transistors of the six transistors.

31. The dynamic random access memory integrated circuitry of claim 28, wherein two of the three electrically conductive interconnects each electrically interconnect two of the six transistors, and one of the electrically conductive interconnects electrically interconnects three of the six transistors.

32. The dynamic random access memory integrated circuitry of claim 27, wherein:

the six transistors are disposed generally in a linear direction; and two of the three electrically conductive interconnects each electrically interconnect two of the six transistors, and one of the electrically conductive interconnects electrically interconnects three of the six transistors, the one of the electrically conductive interconnects having a portion disposed intermediate portions of the two of the electrically conductive interconnects along said direction.

* * * * *